(12) United States Patent
Nakao et al.

(10) Patent No.: US 7,338,308 B2
(45) Date of Patent: Mar. 4, 2008

(54) IC SOCKET

(75) Inventors: Kenzo Nakao, Furukawa (JP); Hsiu-Yuan Hsu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/324,618

(22) Filed: Jan. 3, 2006

(65) Prior Publication Data

US 2006/0148298 A1    Jul. 6, 2006

(30) Foreign Application Priority Data

Dec. 31, 2004    (TW) .............................. 93221349 U

(51) Int. Cl.
*H01R 13/62* (2006.01)
(52) U.S. Cl. ........................................ 439/331; 439/73
(58) Field of Classification Search ................ 439/342, 439/330–331, 70–71, 266, 73
See application file for complete search history.

(56) References Cited

U.S. PATENT DOCUMENTS

| 4,940,432 A | * | 7/1990 | Consoli et al. ............. 439/862 |
| 5,120,238 A | * | 6/1992 | Marks et al. ............... 439/331 |
| 5,244,404 A | * | 9/1993 | Kishi et al. ................. 439/331 |
| 6,033,235 A | * | 3/2000 | Ikeya ......................... 439/71 |
| 6,547,580 B1 | * | 4/2003 | Leavitt et al. .............. 439/266 |
| 7,030,638 B2 | * | 4/2006 | Stutzman .................... 324/765 |

* cited by examiner

*Primary Examiner*—Michael C. Zarroli
(74) *Attorney, Agent, or Firm*—Wei Te Chung

(57) ABSTRACT

An IC socket for testing an IC package is provided including a socket body (10), a press cover (14) preferably pivotally mounted to a first longitudinal end (101) of the socket body so as to be rotatable with respect to the socket body, and a press member (12) disposed between the socket body and the press cover to have an end thereof (121) essentially pivotally mounted to the press cover at a position adjacent the first longitudinal end of the socket body. Thus, by providing the mounting of the press member to the press cover at such a position, a latching member (141) detachably attached to the press cover will be less damaged in comparison with the conventional IC socket.

15 Claims, 9 Drawing Sheets

(The Related Art)

(The Related Art)

(The Related Art)

(The Related Art)

IC SOCKET

Cross-Reference to related application Ser. No. 11/338, 137.

BACKGROUND OF THE INVENTION

1. Field of the Invention

The present invention relates to electrical connectors, and more particularly to IC sockets for holding IC packages.

2. Discussion of the Related Art

A conventional IC socket 1' for testing an IC package is shown in FIGS. 8 to 11. The IC socket 1' includes an insulative socket body 10' defining a substantially rectangular receiving region with a plurality of terminals (not shown) assembled therein, for electrically engaging with the IC package (not shown) placed onto the receiving region of the socket body 10'. A press cover 11' is pivotally mounted to and rotatable about an end of the insulative socket body 10', with a latching element 112' formed on a free end of the press cover 11' for engaging with a tongue 1041' formed on an opposite end of the insulative socket body 10' so as to effectively produce a large pressing force exerted against the IC package of the IC socket 1' when the IC socket is placed on a closed position. Thus, a reliable electrical connection between the IC package and the IC socket 1' is formed by tightly engagement of the latching element 112' of the press cover 11' and the tongue 1041' of the insulative socket body 10'. It is well-known that, if there are more terminals assembled in the IC socket 1', much more large pressing force is needed to be exerted on the IC package of the IC socket to assure such a reliable electrical connection between the IC package and the IC socket. In other words, the pressing force exerted on the IC package is at least proportional to a total reaction force created by the terminals.

A problem with the above IC socket 1' is that, the latching element 112', generally made of insulative material, tends to be damaged with the increasingly number of the terminals. That is because when the number of the terminals increases, much more pressing force is required to be exerted on the IC package, which has an adversely action on the latching element 112' of the press cover 11', thereby causing the latching element 112' loosely or no longer tightly engage with the tongue 1041' of the insulative socket body 10' due to no bearing of the adversely action of much more pressing force. Thus, less reliable electrical connection is formed between the IC package and the IC socket.

Next, for better illustration of relationship between the number of the terminals and the damage of the latching element 112', equation (1)' is obtained by a vertical balance Y' of the respective forces $F_1'$, $F_C'$ and $F_L'$, and equation (2)' is obtained by a torque balance of the respective forces $F_1'$, $F_C'$ and $F_L'$ at point B':

$$F_C' = F_1' + F_L' \qquad (1)'$$

$$F_1' \times L_1' = F_C' \times L_1'/2 \qquad (2)'$$

wherein $F_C'$ denotes a reaction force created by a total number of terminals, associated with the pressing force exerted against the IC package; $F_1'$ denotes a force acting on the press cover 11' from the insulative socket body 10' at point A' where the press cover 11' is pivotally mounted to the insulative socket body 10'; $F_L'$ denotes a force acting on the latching element 112' from the insulative socket body 10' at point B' where the latching element 112' engages with the insulative socket body 10'; $L_1'$ denotes a horizontal distance between point A' and point B'.

Accordingly, a correlation characteristic of the force $F_1'$ and the force $F_C'$ can be obtained by equation (2)':

$$F_1' = F_C'/2 \qquad (3)'$$

By substituting the equation (3)' into the equation (1)', equation (4)' representing a correlation characteristic of the force $F_L'$ and the force $F_C'$ can be obtained:

$$F_L' = F_C'/2 \qquad (4)'$$

Thus, from the equation (4)', the force $F_L'$ acting on the latching element 112' is equal to half of the force $F_C'$ created by the total terminals. This indicates that the force $F_L'$ will proportionally grow with the force $F_C'$ associated with the number of terminals. Therefore, when the number of terminals increases, the proportionally-increased force $F_L'$ will result in the damage of the latching element 112'.

Therefore, it is desired to provide a new IC socket which overcomes the above-mentioned disadvantage.

DETAILED DESCRIPTION OF THE PREFERRED EMBODIMENTS

Figure 1:
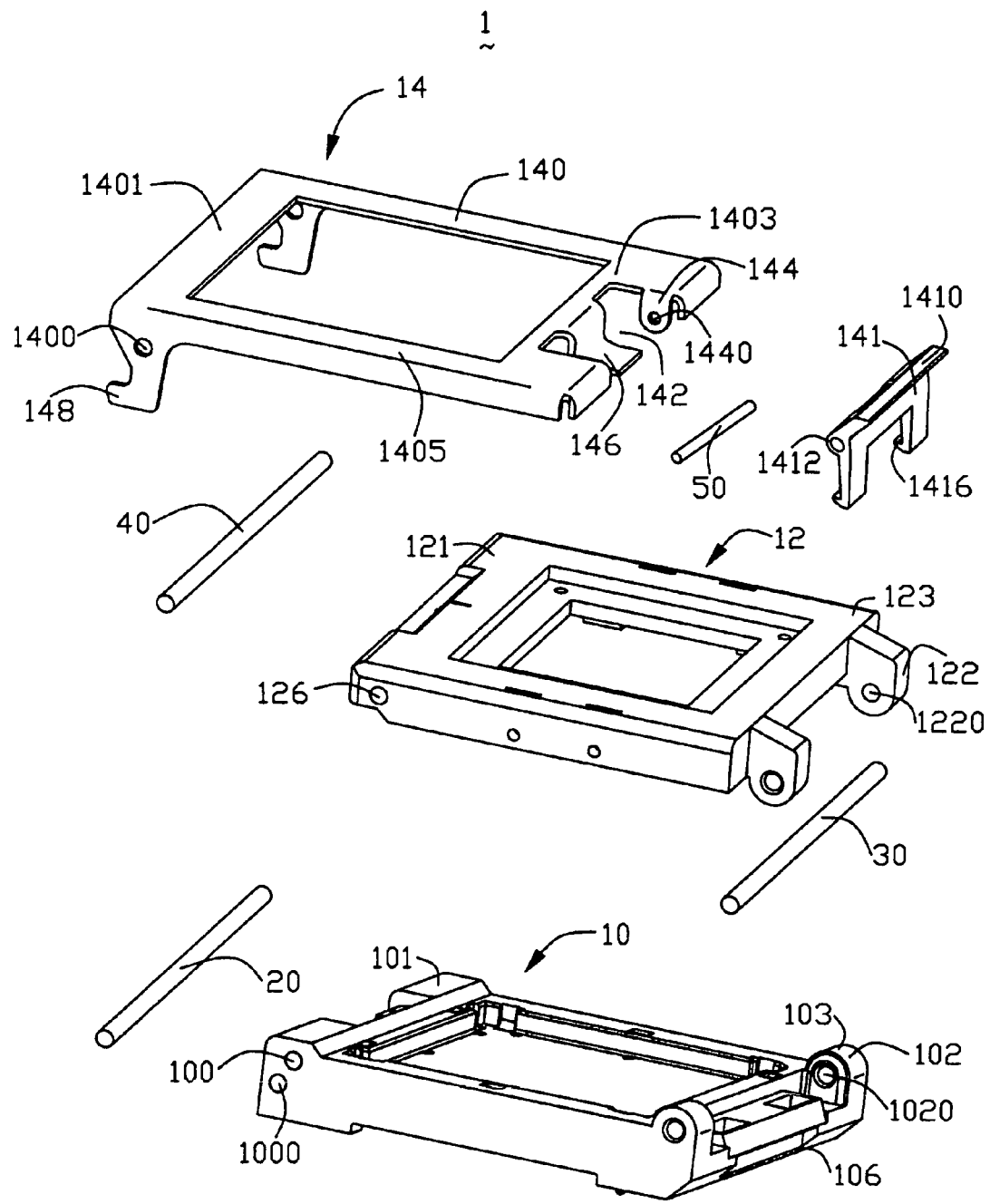
FIG. 1 is an exploded, isometric view of an IC socket according to a preferred embodiment of the present invention.
Figure 2:
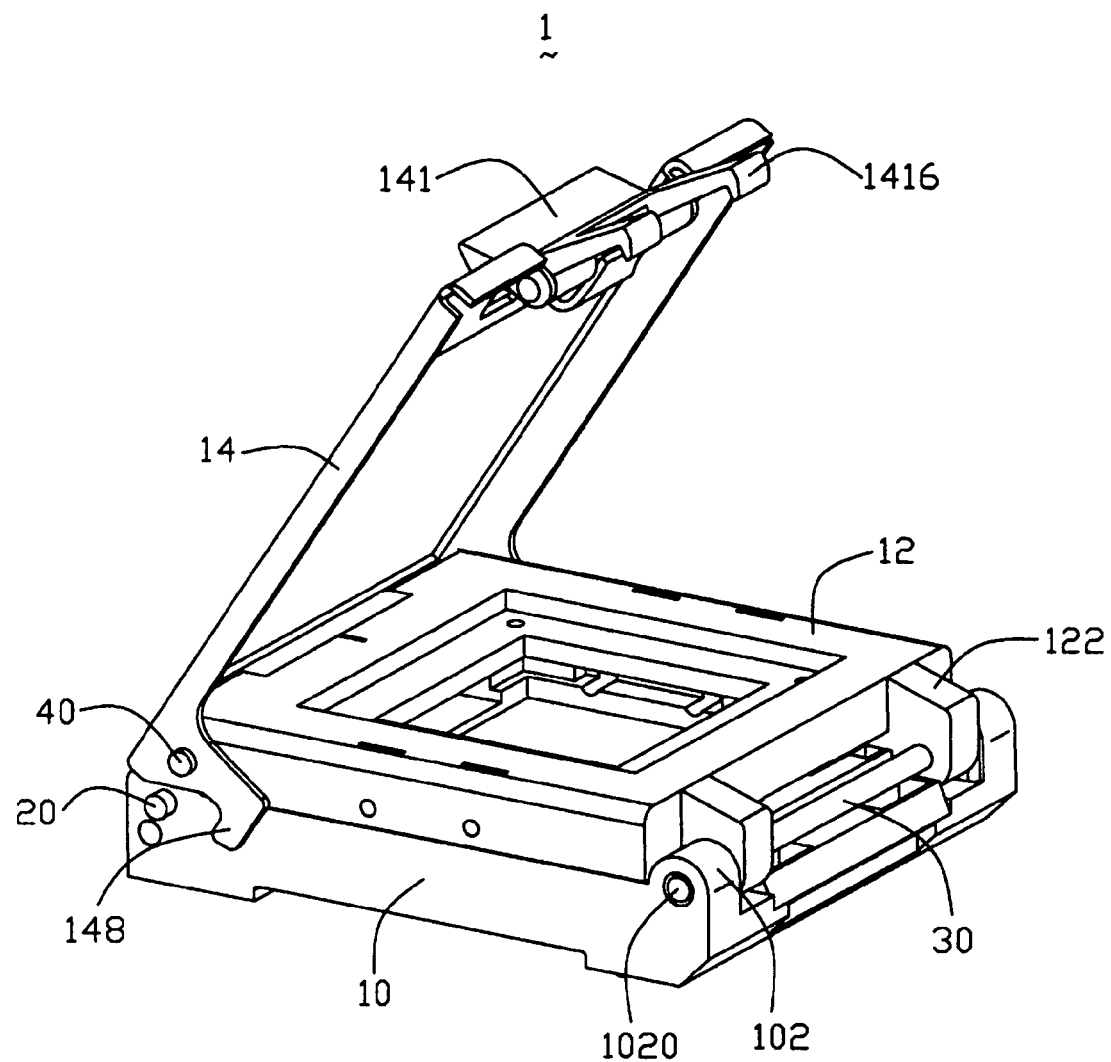
FIG. 2 is an assembled, isometric view of the IC socket of FIG. 1, showing a state before the IC socket is at a fully-opened position.

Referring to FIGS. 1 to 5, an IC socket 1 for testing an IC package (not shown) according to the preferred embodiment of the present invention is shown. The IC socket 1 includes a socket body 10 having a first longitudinal end 103 and a second longitudinal end 101, a press cover 14 preferably pivotally mounted to the second longitudinal end 101 of the socket body 10 so as to be rotatable with respect to the socket body 10, and a press member 12 disposed between the socket body 10 and the press cover 14 to have an end thereof 121 essentially pivotally mounted to the press cover 14 at a position adjacent the first longitudinal end 103 of the socket body 10. Thus, by providing the mounting of the press member 12 to the press cover 14 at such a position, a latching member 141 detachably attached to the press cover 14 will be less damaged in comparison with the conventional IC socket, to be later described in detail.

Figure 3:
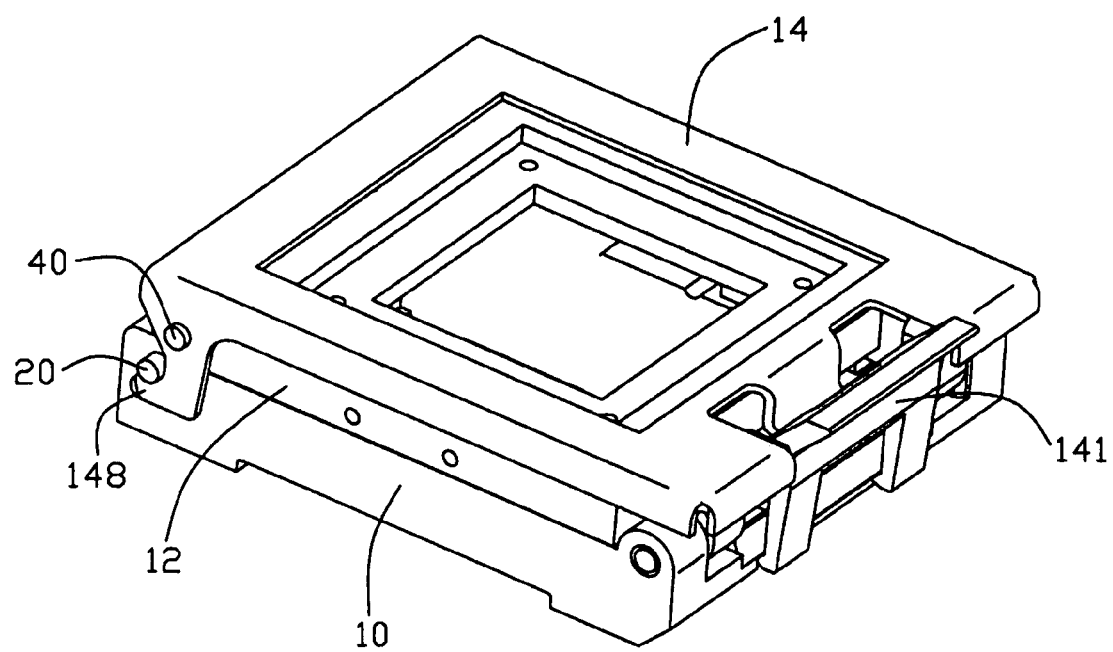
FIG. 3 is an assembled, isometric view of the IC socket of FIG. 1, showing the IC socket at a closed position.
Figure 4:
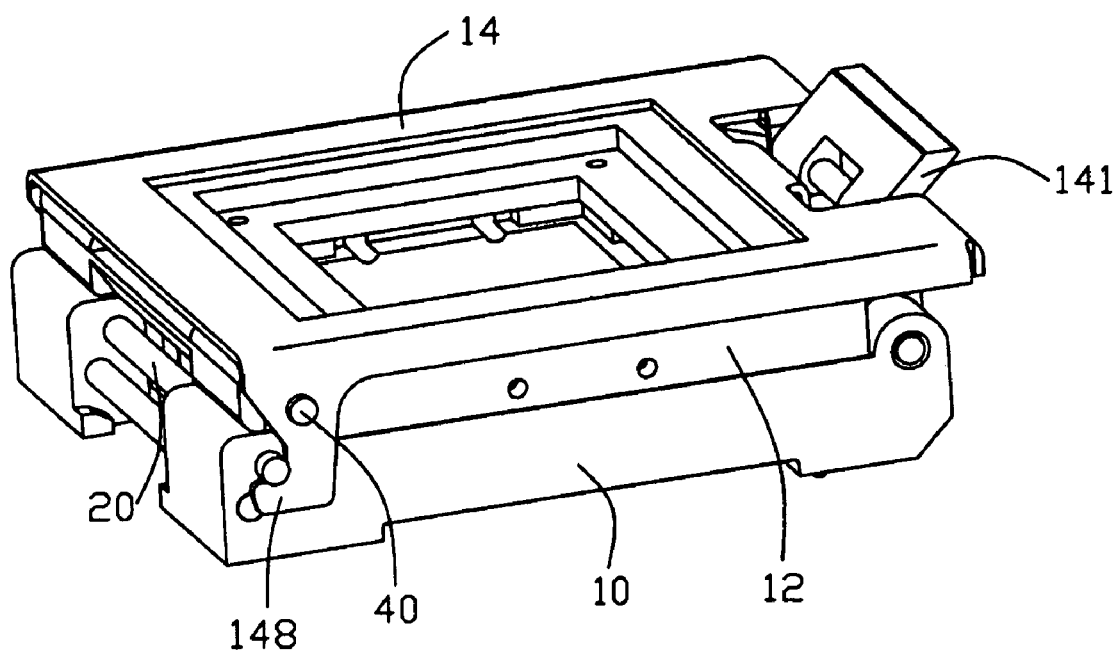
FIG. 4 is an isometric view of the IC socket of FIG. 3, but viewed from another aspect thereof.

The socket body 10 is generally of a rectangular shape, preferably made from an insulative material. In the preferred embodiment, the socket body 10 includes a rectangular receiving window 104 formed in the center thereof, and two opposite longitudinal first end 103 and second end 101 that are separated by the window 104, wherein the receiving window 104 is adapted for accommodating the IC package (not shown) therein. The receiving window 104 has a top mating surface shaped and sized to comply with a bottom mounting surface of the press member 12 in order to assure engagement of the press member 12 and the socket body 10. The second longitudinal end 101 of the socket body 10 is provided with two longitudinally extending holes 100, 1000 for corresponding crossbars 20 to penetrate therethrough. Referring particularly to FIGS. 3 and 4, a reliable pivotal movement is formed between the press cover 14 and the socket body 10 by having two opposite ends of one holding shaft 20 after assembled projecting from corresponding side walls of the socket body 10 to allow for catches 148 of the press cover 14 to be pivotally movable about the holding shaft 20, and having two opposite ends of another holding shaft 20 not extending from the side walls adjacent the bole 1000 but abutting against the catches 148 when the press cover 14 is assembled to the socket body 10. A pair of spaced ribs 102 is arranged on the second longitudinal end 103 of the socket body 10, with a longitudinally extending hole 1020 formed in each of the ribs 102 to cooperatively allow for a second holding shaft 30 to penetrate therethrough, to be later described. An outward projecting block is formed between the pair of ribs 102, with an interlocking portion, preferably a slot 106, defined therebeneath for engaging with the latching member 141 of the press cover 14.

The press member 12 is preferably made of an insulative material, and configured to have a rectangular shape in compliance with the receiving window 104 of the socket body 10 so as to engage with the socket body 10. The press member 12 defines in the center thereof a receiving region, with a first end section thereof 123 and a second end section 121 forming a longitudinally extending hole 126 therein to allow for a first holding shaft 40 to penetrate therethrough so as to form a pivotal connection between the press member 12 and the press cover 14, and the first end section thereof 123 preferably forming a pair of outwardly projecting portions 122 with holes 1220 therein to cooperatively allow for a second holding shaft 30 to penetrate therethrough so as to form a pivotal or movable connection between the press member 12 and the first longitudinal end 103 of the socket body 10.

The press cover 14 is generally of a rectangular shape, preferably made of metallic material. A second end 1401 of the press cover 14 is formed with a pair of press cover holes 1400 to cooperatively allow for the first holding shaft 40 to penetrate in sequence through the press member hole 126 and the press cover holes 1400, thereby forming a pivotal connection between the press cover 14 and the press member 12 via the first holding shaft 40. And a pair of catches 148 adjacent the press cover holes 1400 is configured to extend downwardly and slightly outwardly from the second end 1401 of the cover press 14 to grip the outwardly projecting ends of the first holding shaft 40 assembled to the press member 12 so as to tie pivotally or rotatably moved about the second end 1401 longitudinal end 101 of the socket 10. The press cover 14 has a first opposite end thereof 1403 defining at a middle thereof a slit 142 with a pair of downwardly extending portions 144 formed at opposite side edges of the slit 142, such that the latching member 141 is engageably held by the downwardly extending portions 144 so as to be pivotally or rotatably moved about the first end 1403 of the press cover 14, thereby achieving effective engagement of the latching member 141 and the slot 106 of the socket body 10 by pivotal movement of the latching member 141 towards the first longitudinal end 103 of the socket body 10. Preferably, each of the downwardly extending portions 144 is provided with a tiny recess 1440 to cooperatively allow for a second latching crossbar 50 extending through the latching member 141 to be retained therein, in order to assist in the pivotal movement of the latching member 141 about the second end 1401 of the press cover 14. Further, a downwardly and outwardly extending tongue 146 is formed on a side of the slit 142 for the latching member 141 to be seated thereon during an opening operation of the press cover 14.

In the preferred embodiment, the latching member 141 is made of insulative material. However, in other alternative embodiments, the latching member 141 is made of metallic material, or any other suitable material depending on particular applications. The latching member 141 includes a connection bar 1410 defining a central hole 1412 therein for the crossbar 50 to be penetrated therethrough so as to achieve a pivotal connection between the latching member 141 and the press cover 14. Further, a pair of spaced catches 1416 is configured to extend downwardly from the connection bar 1410, for engaging with the slot 106 located at the first longitudinal end 103 of the socket body 10.

Figure 5:
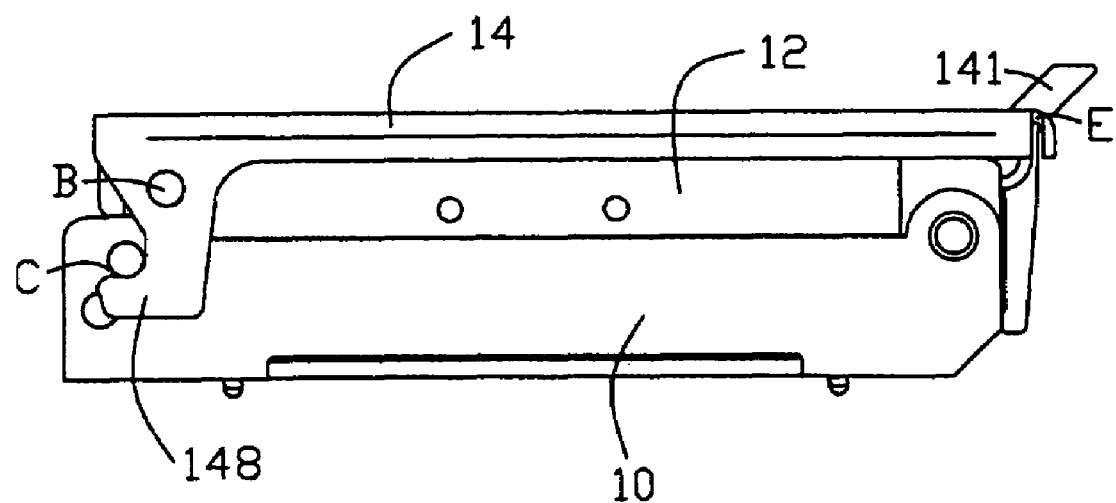
FIG. 5 is a side, plan view of the IC socket of FIG. 4.

Referring particularly to FIGS. 1 to 4, in use, the IC package (not shown) is preloaded into the receiving window 104 of the socket body 10. The press member 12 is firstly rotated to a horizontal position by pivotal connection via the second holding shaft 30 between the press member 12 and the first longitudinal end 103 of the socket body 10. The press cover 14 is also rotated to the horizontal position to be seated on the press member 12 by pivotal movement via the catches 148 between the press cover 14 and the first longitudinal end 103 of the socket body 10. Then, the latching member 141 is urged to be pivotally rotated towards the first longitudinal end 103 of the socket body 10 so as to tightly engage with the slot 106 of the socket body 10, thereby holding the IC package securely in the socket body 10. Referring to FIG. 5, when the IC socket is placed at a closed position, from a front view thereof, a position B where the press member 12 is pivotably mounted to the press cover 14 is laterally offset from a position C where the press cover 14 is rotatably mounted to the socket body 10, and a location E where the latching member 141 is pivotally attached to the press cover 14, from a front view thereof, is preferably slightly laterally offset from the first longitudinal end 103 of the socket body 10 such that the latching member 141 is laterally movable towards the first longitudinal end of the socket body 10 so as to tightly engage with the first longitudinal end 103 of the socket body 10.

Figure 6:
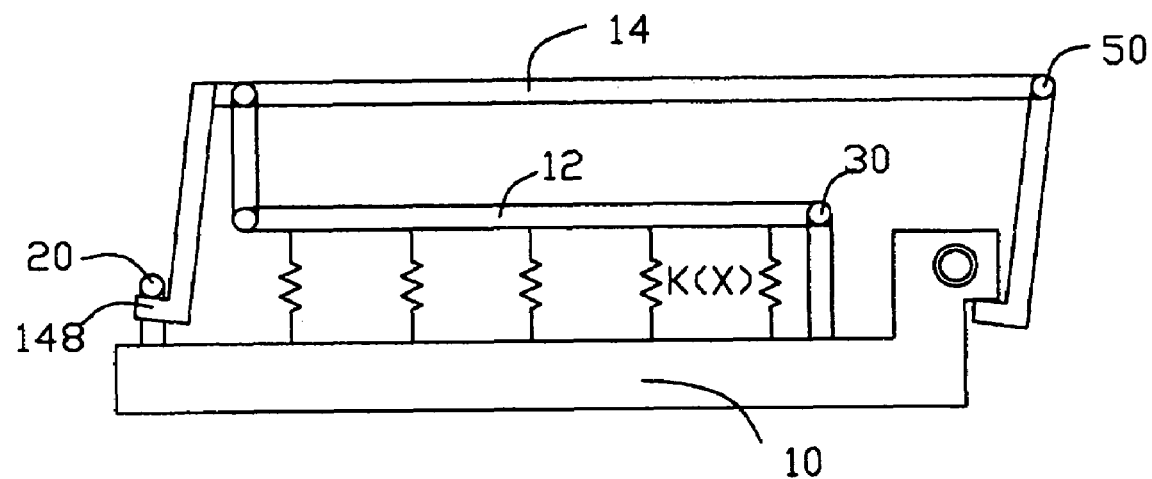
FIG. 6 is an illustration view showing a state of the closed IC socket of FIG. 3.
Figure 7:
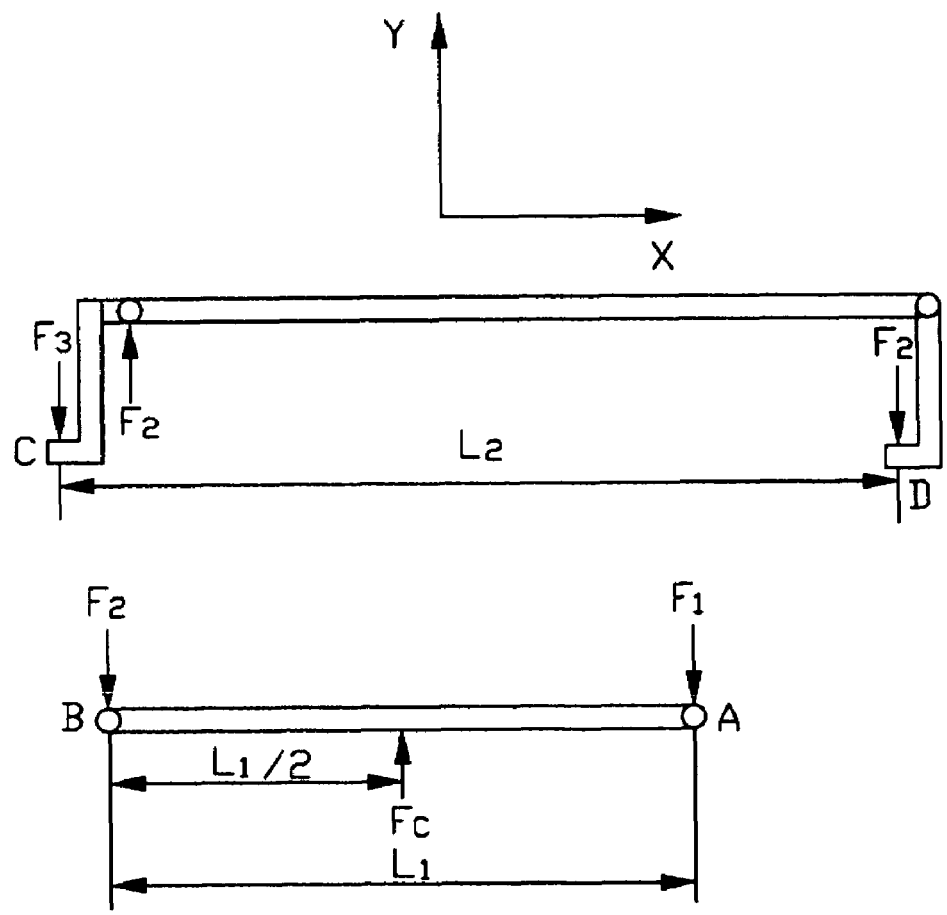
FIG. 7 is an illustration view showing balancing of forces on respective press cover and press member of the IC socket of FIG. 6.
Figure 8:
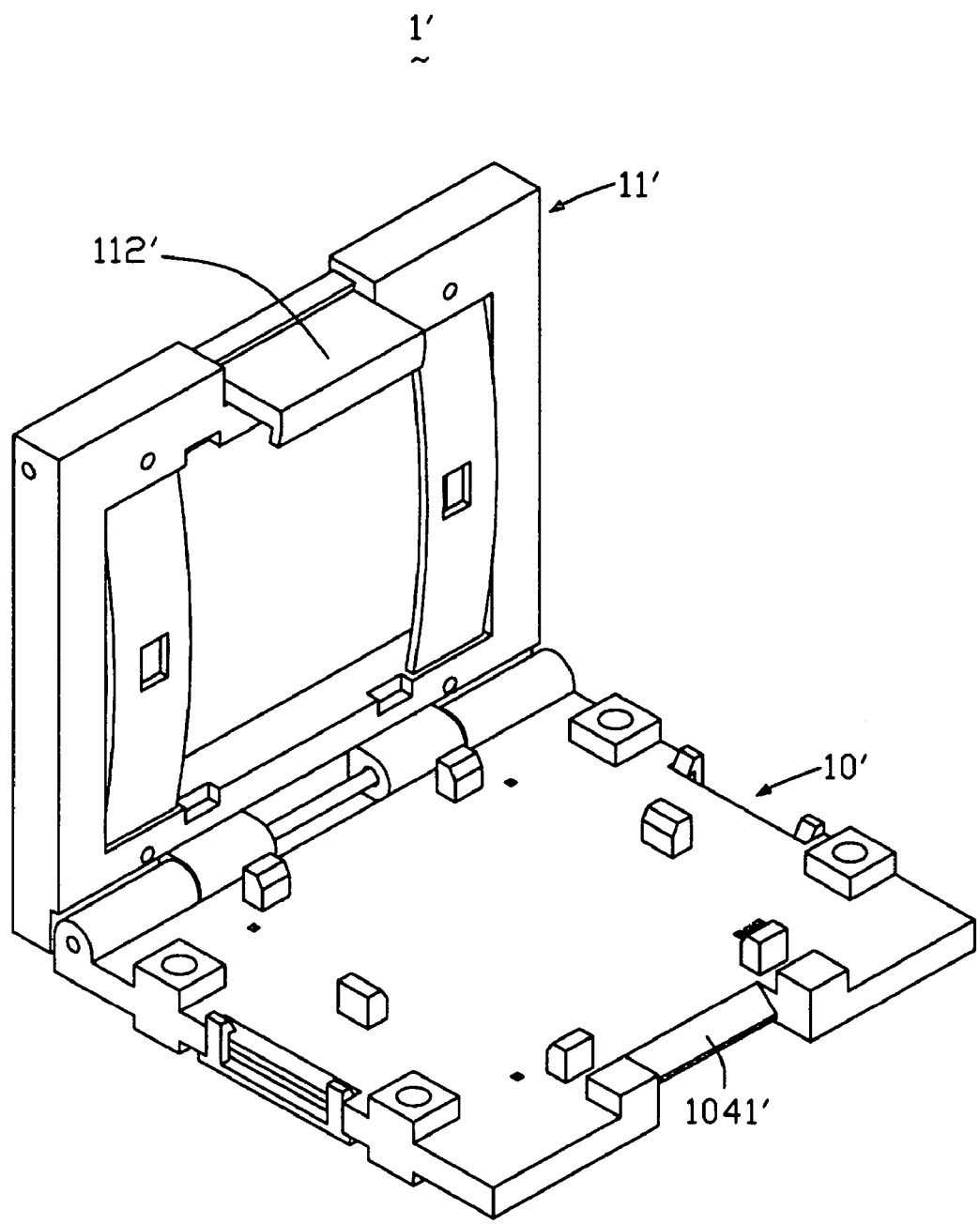
FIG. 8 is an isometric view of a conventional IC socket, showing the conventional IC socket at a closed position.
Figure 9:
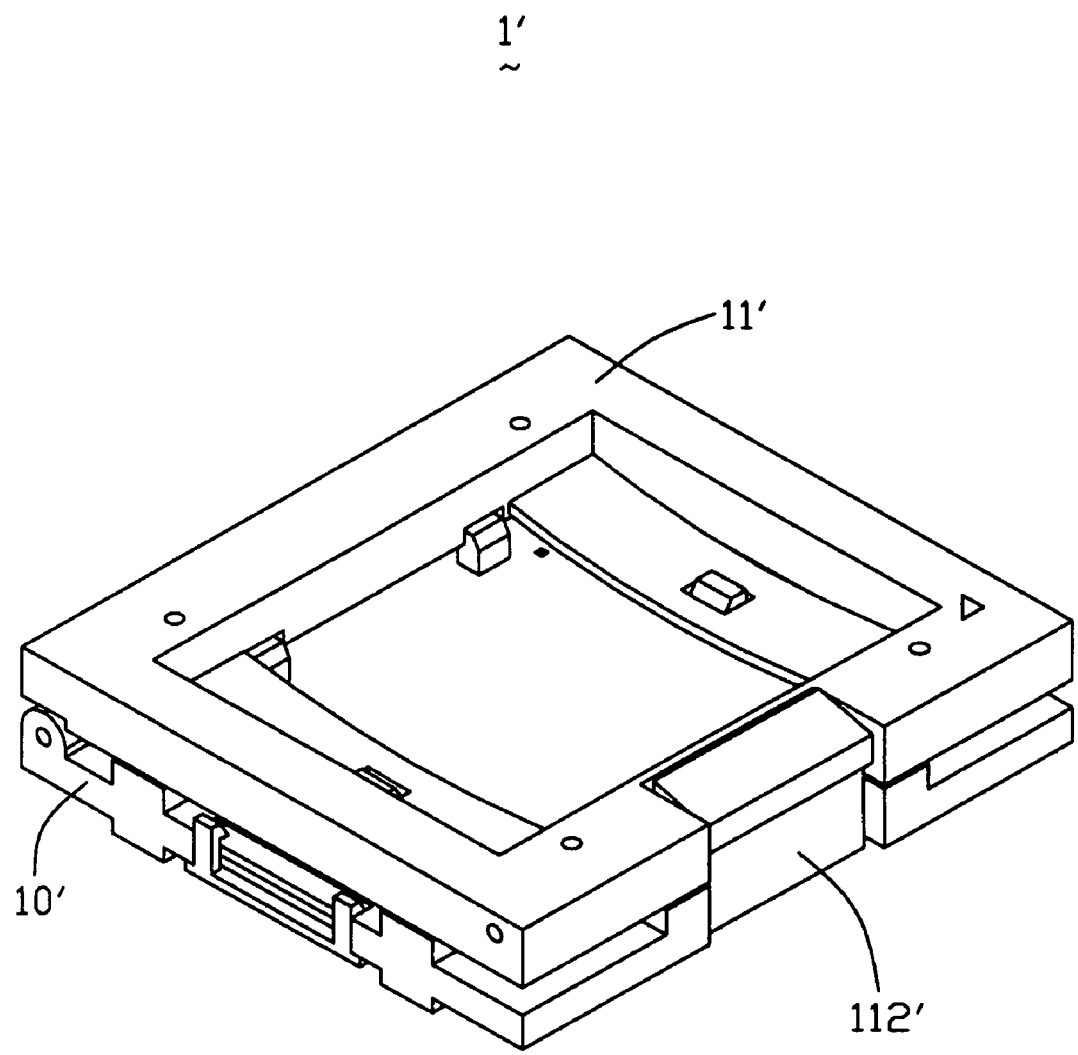
FIG. 9 is an isometric view of the IC socket of FIG. 8, but showing the IC socket at a closed position.
Figure 10:
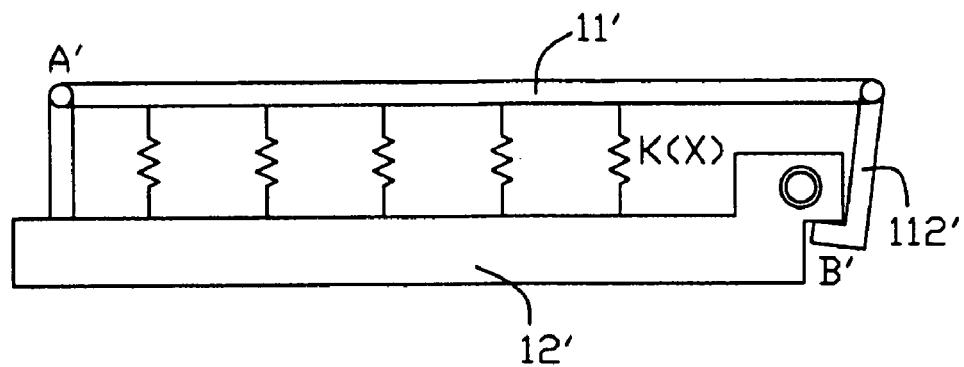
FIG. 10 is an illustration view showing a state of the closed IC socket of FIG. 9.
Figure 11:
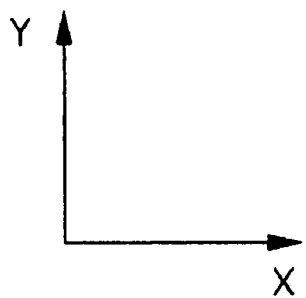
FIG. 11 is an illustration view showing balancing of forces on a press cover of the IC socket of FIG. 10.
Figure 11:
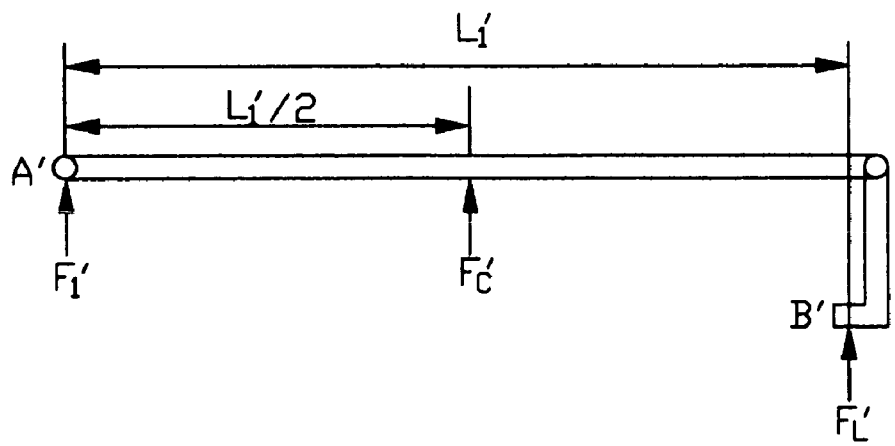

Referring particularly to FIGS. 6 to 7, in consideration of balancing of forces on the press member 12, equation (1) is obtained by a vertical balance Y of the respective forces $F_1$, $F_C$ and $F_L$, and equation (2) is obtained by a torque balance of the respective forces $F_1$, $F_C$ and $F_L$ at point A:

$$F_C = F_1 + F_L \quad (1)$$

$$F_2 \times L_1 = F_C \times L_1/2 \quad (2)$$

wherein $F_C$ denotes a reaction force acting on the press member 12 from a total number of terminals; $F_1$ denotes a force acting on the press member 12 from the insulative socket body 10 at point A where the press member 12 is pivotally mounted to the insulative socket body 10; $F_2$ denotes a force acting on the press member 12 from the press cover 14 at point B where the press member 12 is pivotally mounted to the press cover 14; $L_1$ denotes a horizontal distance between point A and point B.

Accordingly, equation (3) representing a correlation characteristic of the force $F_2$ and the force $F_C$ can be obtained through the equation (2):

$$F_2 = F_C/2 \quad (3)$$

At the same time, in consideration of balancing of forces on the press cover 14, equation (4) is obtained by a vertical balance Y of the respective forces $F_2$, $F_3$ and $F_L$, and equation (5) is obtained by a torque balance of the respective forces $F_2$, $F_3$ and $F_L$ at point D:

$$F_2 = F_3 + F_L \quad (4)$$

$$F_3 \times L_2 = F_2 \times L_1 \quad (5)$$

wherein $F_2$ denotes a force acting on the press cover 14 from the press member 12 at point B where the the press member 12 is pivotally mounted to the press cover 14; $F_3$ denotes a force acting on the press cover 14 from the insulative socket body 10 at point C where the press cover 14 is pivotally mounted to the insulative socket body 10; $F_L$ denotes a force acting on the latching member 141 of the press cover 14 from the insulative socket body 10 at point D where the latching member 141 engages with the insulative socket body 10; $L_2$ denotes a horizontal distance between point C and point D.

By substituting the equation (3) into the equation (5), equation (6) can be obtained:

$$F_3 = F_C L_1 / 2L_2 \quad (6)$$

By substituting the equation (6) into the equation (4), equation (7) can be obtained:

$$F_L = F_C (L_2 - L_1)/2L_2 \quad (7)$$

Here assuming that it is true $(L_2-L_1)/L_2 << 1$, since $L_2$ is close proximate to $L_1$, equation (8) can be obtained accordingly:

$$F_L << F_C/2 \quad (8)$$

Therefore, it is obvious that, from the equation (8), the force $F_L$ acting on the latching member 141 is much less than half of the reaction force $F_C$ created by the total number of terminals, in comparison with the force the force $F_L'$ of the conventional IC socket. As a result, there is less possibility for the latching member 141 of the preferred embodiment to be damaged.

While the present invention has been described with reference to embodiments, the description of the invention is illustrative and is not to be construed as limiting the invention. Various of modifications to the present invention can be made to embodiments by those skilled in the art without departing from the true spirit and scope of the invention as defined by the appended claims.

What is claimed is:

1. An IC socket assembly comprising:
   a socket body adapted to accommodate an IC package and defining opposite first and second longitudinal ends (103, 101) along a front-to-back direction;
   a press member pivotal defining opposite first and second end sections (123, 121) along said front-to-back direction, said first end section (123) pivotally attached to the first longitudinal end (103);
   a press cover defining opposite first and second end (1403,1401) along said front-to-back direction, the second end (1401) pivotally attached to the second end section (121) and at least one catches (148) extending form lateral side of the second end (1401);
   a latching member (141) pivotally attached to the first end (1403) with a locking portion locked to the socket body around said first end; wherein
   a plurality of terminals are disposed in the socket body and provide an upward forces to indirectly urge the press member and the press cover upwardly;
   wherein the first end of the press cover defines a slit with a pair of downwardly extending portions respectively formed at opposite side edges of the slit.

2. the IC socket assembly as claimed in claim 1, wherein said press cover further includes a lock section to lock to the socket body around the second end.

3. the IC socket assembly as claimed in claim 1, wherein said IC package is sandwiched between the press member and the socket body to transfer the upward forces of the terminals to the press member and the press cover.

4. the IC socket assembly as claimed in claim 1, wherein said first end, said first end section and said first region are close to one another in a first imaginary vertical, and said second end, said second end section and said second end region are close to one another in a second imaginary plane opposite to said first imaginary plane.

5. An IC socket assembly comprising:
   a socket body defining opposite first and second longitudinal ends (103, 101) along a front-to-back direction;
   an IC package directly seated upon the socket body;
   a press member directly located on said IC package and defining opposite first and second end sections (123, 121) in said front-to-back direction, the first end section (123) pivotally engaged with the first longitudinal end (103) of the socket body;
   a press cover defining opposite first and second ends (1403, 1401) along said front-to-back direction, the second end (1401) pivotally attached to the second end section (121); and
   a latching member (141) pivotally attached to the first end (1403) with a locking portion locked to the socket body around said first longitudinal end; wherein
   a plurality of terminals are disposed in the socket body and provide upward forces to directly urge said IC package upward so as to directly urge the press member and said press cover upwardly.

6. the IC socket assembly as claimed in claim 5, wherein the first longitudinal end, the first end section and the first end are positioned adjacent to one another, and the second longitudinal end, the second end section and the second end are positioned adjacent to one another.

7. the IC socket assembly as claimed in claim 5 wherein the first end section is pivotally attached to the first end.

8. the IC socket assembly as claimed in claim 5 wherein a hook is unitarily formed at the second end and latched to the second longitudinal end, when the socket body, the press member and the press cover are essentially stacked with one another.

9. An IC socket comprising:
   a socket body adapted to accommodate an IC package, and having a first longitudinal end with a slot thereof;
   a press member pivotally assembled to the socket body adjacent to the first longitudinal end of the socket body, and including first and second end sections;
   a press cover pivotally disposed on the press member at the second end section of the press member and rotatable with respect to the press member, and further including a pair of extending portions at a free end defining a space therebetween and with a latching member pivotally mounted therebetween engaged to the slot in the first longitudinal end of the socket body when the press member is closed to the socket body.

10. The IC socket as recited in claim 9, wherein said press member is mounted through a holding shaft to the first longitudinal end of the socket body.

11. The IC socket as recited in claim 10, wherein the holding shaft is configured to penetrate through said press member.

12. The IC socket as recited in claim 11, wherein said press member is provided with at least one outwardly projecting portion defining a through hole for the holding shaft to penetrate therethrough.

13. The IC socket as recited in claim 9, wherein the latching member is pivotally attached to the press cover.

14. The IC socket as recited in claim 13, wherein the latching member is pivotally mounted to an end of the press cover located adjacent the first longitudinal end of the socket body.

15. The IC socket as recited in claim 13, wherein the latching member is pivotally mounted lo the press cover at a location, from a front view thereof, laterally offset from the second longitudinal end of the socket body such that the latching member is pivotally movable toward the first longitudinal end of the socket body for engaging with the first longitudinal end of the socket body.

* * * * *